United States Patent
Morris et al.

(10) Patent No.: US 11,434,764 B2
(45) Date of Patent: Sep. 6, 2022

(54) PROCESS FOR REPAIRING TURBINE ENGINE COMPONENTS

(71) Applicant: United Technologies Corporation, Farmington, CT (US)

(72) Inventors: Robert J. Morris, Portland, CT (US); William D. Owen, Windsor, CT (US); Stuart K. Montgomery, Jupiter, FL (US); Ron I. Prihar, West Hartford, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 174 days.

(21) Appl. No.: 16/520,951

(22) Filed: Jul. 24, 2019

(65) Prior Publication Data

US 2020/0102827 A1    Apr. 2, 2020

Related U.S. Application Data

(60) Provisional application No. 62/717,935, filed on Aug. 13, 2018.

(51) Int. Cl.
  *F01D 5/00* (2006.01)
  *F01D 5/02* (2006.01)

(52) U.S. Cl.
  CPC .......... *F01D 5/005* (2013.01); *F01D 5/021* (2013.01); *F05D 2230/10* (2013.01); *F05D 2230/80* (2013.01)

(58) Field of Classification Search
  CPC .............................. F01D 5/005; F05D 2230/80
  See application file for complete search history.

(56) References Cited

U.S. PATENT DOCUMENTS 8,024,137 B2   9/2011  Kuehhorn et al.
8,045,144 B2   10/2011 Manfred
(Continued)

FOREIGN PATENT DOCUMENTS

| CN | 105598450 | 5/2016 |
| DE | 102012013949 | 1/2014 |
| EP | 3264341 | 1/2018 |

OTHER PUBLICATIONS

Finite Element Method, Wikipedia, available at https://en.wikipedia.org/wiki/Finite_element_method, Screen shot taken on Apr. 4, 2017 (Year: 2017).*

(Continued)

*Primary Examiner* — Moshe Wilensky
*Assistant Examiner* — Kyle A Cook
(74) *Attorney, Agent, or Firm* — Carlson, Gaskey & Olds, P.C.

(57) ABSTRACT

A process for repairing an aircraft engine component includes receiving a plurality of component measurements of a damaged component, comparing the plurality of component measurements of the damaged component to a finite element model of an ideal component, generating a finite element model of the damaged component based at least partially on the comparison, determining a corrective material removal operation based at least in part on the finite element model of the damaged component, and removing material from the damaged component according to the corrective material removal operation, thereby creating a repaired component.

18 Claims, 3 Drawing Sheets

(56) References Cited

U.S. PATENT DOCUMENTS

| | | |
|---|---|---|
| 8,505,384 B2 | 8/2013 | Lomenzo |
| 9,382,916 B2 | 7/2016 | Schoenenborn |
| 2002/0161483 A1* | 10/2002 | Vaidyanathan .... G05B 19/4207 700/275 |
| 2004/0148793 A1* | 8/2004 | Holder .................... F01D 5/005 33/562 |
| 2005/0033555 A1* | 2/2005 | Tanner .................... F01D 5/005 702/183 |
| 2011/0264413 A1* | 10/2011 | Stankowski ............ B23P 6/005 703/1 |
| 2013/0180107 A1* | 7/2013 | Woods .................... F01D 5/005 29/889.1 |
| 2016/0297044 A1 | 10/2016 | Dunkin et al. |
| 2017/0268963 A1 | 9/2017 | Conner et al. |
| 2017/0370220 A1* | 12/2017 | Morris .................... F01D 5/005 |
| 2018/0371922 A1* | 12/2018 | Sitkiewicz .............. F01D 5/005 |

OTHER PUBLICATIONS

Extended European Search Report for Application No. 19190609.8 dated Mar. 26, 2020.

* cited by examiner

PROCESS FOR REPAIRING TURBINE ENGINE COMPONENTS

CROSS-REFERENCE TO RELATED APPLICATION

This application claims priority to U.S. Provisional Application No. 62/717,935 filed on Aug. 13, 2018.

TECHNICAL FIELD

The present disclosure relates generally to turbine engine repair processes, and more specifically to a system for determining and applying a blend repair process corresponding to a specific damage profile.

BACKGROUND

Gas turbine engines, such as those utilized in commercial and military aircraft, include a compressor section that compresses air, a combustor section in which the compressed air is mixed with a fuel and ignited, and a turbine section across which the resultant combustion products are expanded. The expansion of the combustion products drives the turbine section to rotate. As the turbine section is connected to the compressor section via a shaft, the rotation of the turbine section further drives the compressor section to rotate. In some examples, a fan is also connected to the shaft and is driven to rotate via rotation of the turbine as well.

During operation of a gas turbine engine, internal gas turbine engine components can become damaged due to standard wear, debris ingestion, or any other number of known damaging events. Due to the expenses associated with manufacturing gas turbine engine components, it is often more economically viable to repair a damaged component, rather than replacing it. This is particularly true for expensive or difficult to manufacture components.

SUMMARY OF THE INVENTION

In one exemplary embodiment a process for repairing an aircraft engine component includes receiving a plurality of component measurements of a damaged component, comparing the plurality of component measurements of the damaged component to a finite element model of an ideal component, and generating a finite element model of the damaged component based at least partially on the comparison, determining a corrective material removal operation based at least in part on the finite element model of the damaged component, and removing material from the damaged component according to the corrective material removal operation, thereby creating a repaired component.

In another example of the above described process for repairing an aircraft engine component the damaged component is an integrally bladed rotor.

In another example of any of the above described processes for repairing an aircraft engine component determining the corrective material removal operation comprises creating a material removal template and applying the material removal template to the damaged component prior to removing material from the damage component.

Another example of any of the above described processes for repairing an aircraft engine component further includes predicting a performance of the repaired component by providing the finite element model of the damaged component and the corrective material removal operation to a mathematical model.

Another example of any of the above described processes for repairing an aircraft engine component further includes comparing an output of the mathematical model against a predetermined set of criteria, and determining the acceptability of the corrective material removal operation based at least in part on the output of the mathematical model.

In another example of any of the above described processes for repairing an aircraft engine component determining the acceptability of the corrective material removal operation includes comparing the output of the mathematical model to at least one of a mistuning range, an aeromechanical performance metric range, and a modeshape range.

Another example of any of the above described processes for repairing an aircraft engine component further includes determining a plurality of component measurements of the repaired component.

In another example of any of the above described processes for repairing an aircraft engine component, the process includes comparing the plurality of component measurements of the repaired component to a finite element model of the ideal component, thereby determining a finite element model of the repaired component.

In another example of any of the above described processes for repairing an aircraft engine component removing material from the damaged component according to the corrective material removal operation comprises an automated material removal operation.

In another example of any of the above described processes for repairing an aircraft engine component removing material from the damaged component according to the corrective material removal operation comprises a manual material removal operation.

In another example of any of the above described processes for repairing an aircraft engine component the repaired component includes a blade, and wherein at least 5% of the surface of the blade is part of a blend.

In another example of any of the above described processes for repairing an aircraft engine component the repaired component includes at least one blend extending into the repaired component by at least 3 mm (0.118 in).

In one exemplary embodiment a process for repairing an integrally bladed rotor includes receiving a plurality of component measurements of a damaged integrally bladed rotor, generating a finite element model of the damaged integrally bladed rotor based at least partially on a finite model of an ideal integrally bladed rotor, determining a corrective material removal operation by at least simulating the damaged integrally bladed rotor under hot conditions, creating a corrective finite element model based on the determined corrective material removal operation, simulating operations of the corrective finite element model under hot conditions, and comparing the simulation to a set of predetermined criteria, and removing material from the damaged component according to the corrective material removal operation, thereby creating a repaired integrally bladed rotor, in response to the simulation meeting the predetermined criteria.

Another example of the above described process for repairing an integrally bladed rotor further includes reiterating the step of determining a corrective material removal operation in response to the simulation not meeting at least one of the predetermined criteria.

In another example of any of the above described processes for repairing an integrally bladed rotor the reiteration further incorporate the results of the simulation corrective finite element model simulation, and wherein the reiteration generates a second corrective removal operation distinct from the first corrective material removal operation.

In another example of any of the above described processes for repairing an integrally bladed rotor determining the corrective material removal operation comprises creating a material removal template and applying the material removal template to the damaged component prior to removing material from the damage component.

In another example of any of the above described processes for repairing an integrally bladed rotor the predetermined criteria includes at least one of mistuning range, an aeromechanical performance metric range, and a modeshape range In one exemplary embodiment an integrally bladed rotor includes a hub ring and a plurality of blades extending radially outward from the hub ring, wherein the hub ring and the blades are a single integral piece, and wherein the integrally bladed rotor includes is a blended integrally bladed rotor and at least one blade of the integrally bladed rotor includes at least one of a surface where at least 5% of the surface of the blade is part of a blend and a blend intruding into the blade by at least 3 mm (0.118 in).

In another example of the above described integrally bladed rotor at least 5% of the surface of a blade in the plurality of blades is part of a blend.

In another example of any of the above described integrally bladed rotors the repaired component includes at least one blend extending into the integrally bladed rotor by at least 3 mm (0.118 in).

These and other features of the present invention can be best understood from the following specification and drawings, the following of which is a brief description.

DETAILED DESCRIPTION OF AN EMBODIMENT

Figure 1:
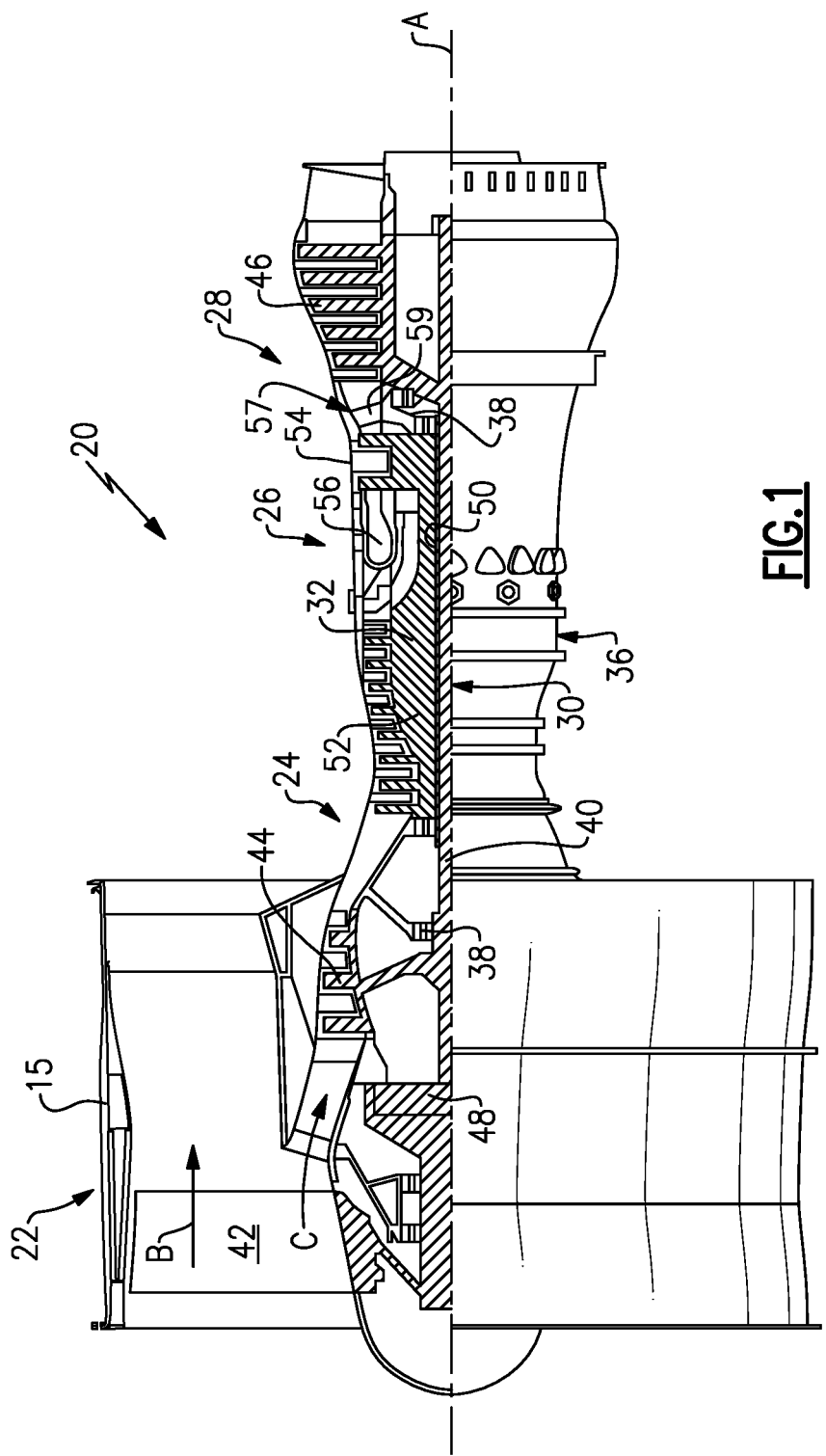
FIG. 1 illustrates an exemplary gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, and also drives air along a core flow path C for compression and communication into the combustor section 26 and then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition— typically cruise at about 0.8 Mach and about 35,000 feet (10,668 meters). The flight condition of 0.8 Mach and 35,000 ft (10,668 meters), with the engine at its best fuel consumption—also known as "bucket cruise Thrust Specific Fuel Consumption ('TSFC')"—is the industry standard parameter of 1 bm of fuel being burned divided by 1 bf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(\text{Tram}\ °\ R)/(518.7°\ R)]^{[<]BEGINITALm0.5}$. The "Low corrected fan tip speed" as disclosed herein according to one non-limiting embodiment is less than about 1150 ft/second (350.5 meters/second).

Figure 2:
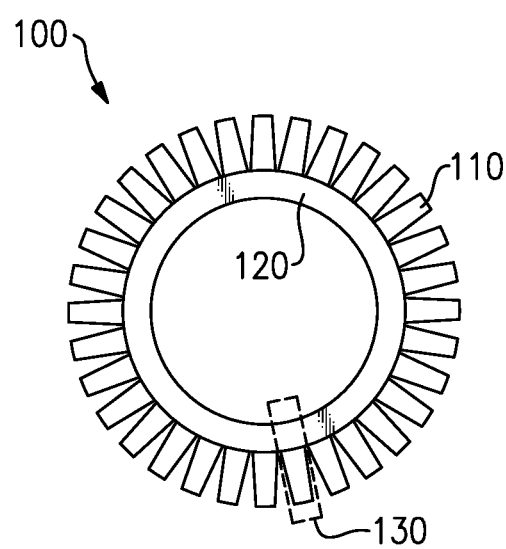
FIG. 2 schematically illustrates an exemplary integrally bladed rotor for the gas turbine engine of FIG. 1.

In some gas turbine engines, such as the engine 20, one or more rotor stage within the compressor or turbine section can be constructed as an integrally bladed rotor. With continued reference to the example engine 20 of FIG. 1, FIG. 2 schematically illustrates one such integrally bladed rotor 100 according to an example. The integrally bladed rotor 100 includes multiple airfoil shaped blades 110 protruding radially outward from a hub ring 120. While installed in the engine 20, each of the blades 110 extends radially into a primary flowpath, and rotates about the engine centerline axis.

When debris is ingested into the engine 20, the debris can pass into the primary flowpath. Due to the rotation of the blades 110 in the primary flowpath, the debris will contact one or more of the blades 110. This contact can cause damage or wear to the blade 110, or blades 110, that are contacted by the debris. When the debris is small enough, the integrally bladed rotor 100 will not become inoperable, and can continue to be used without maintenance. When the debris is large enough, or the wear on the blades 110 is substantial enough, the integrally bladed rotor 100 is no longer suitable for operation and should be removed from the engine. Given the expense associated with integrally bladed rotors 100, and similar engine components, it is desirable to repair the integrally bladed rotor 100 whenever possible, such that it is suitable to be returned to an active engine rather than scrapping the component. In alternative examples, the damage can occur from internal objects that break off within the engine, and impact the integrally bladed rotor airfoils. This is referred to as domestic object damage and can result in similar issues as ingested foreign objects.

Figure 3:
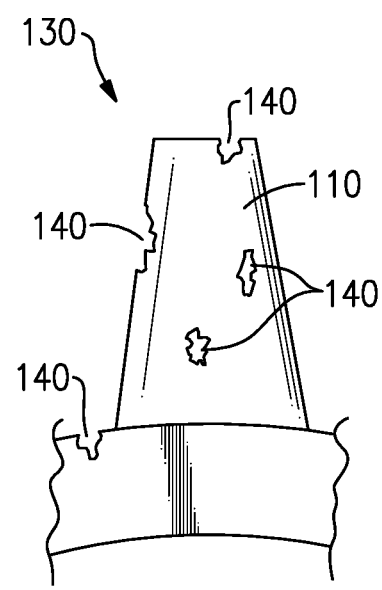
FIG. 3 schematically illustrates an exemplary damaged portion of an integrally bladed rotor.

With continued reference to FIG. 2, FIG. 3 schematically illustrates a portion 130 of the integrally bladed rotor 100 including a substantial amount of wear 140 resulting from utilization of the integrally bladed rotor 100 within a gas turbine engine 20. The size and shape of the wear 140 illustrated in FIG. 3 is exaggerated for illustrative effect. Further, the wear 140 can extend to all of the airfoil blades 110 in a given integrally bladed rotor 100 and the hub ring 120 of the integrally bladed rotor 100 in some examples. In alternative examples, the wear 140 can be limited to a specific localized region.

In order to repair the wear 140, a blending operation can be performed on the integrally bladed rotor 100. A blending operation uses material removal processes, such as milling or CNC material removal, to remove the damaged portion of the integrally bladed rotor 100 and smooth the resulting voids such that the integrally bladed rotor 100 meets the requirements for operation in the engine.

Figure 4:
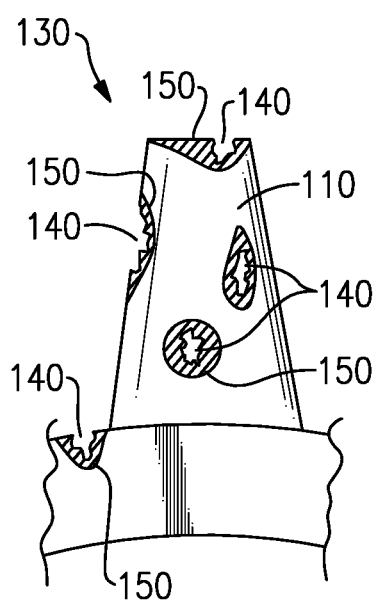
FIG. 4 schematically illustrates a corrective blend operation on the damaged portion of the integrally bladed rotor of FIG. 3.

With continued reference to FIG. 3, FIG. 4 schematically illustrates the damaged portion 130 of FIG. 2, with an additional blending mask 150 applied to each of the locations of the wear 140. As with the locations of the wear 140, the blending masks 150 are highly exaggerated in scale for explanatory effect. The blending masks 150 can be physical masking applied to the actual integrally bladed rotor 100, or shaded colors on computer simulations of the integrally bladed rotor 100. In either case, the blending masks 150 indicate what portions of the material of the blade 110 and/or the hub ring 120 should be removed in order for the blended integrally bladed rotor 100 to be suitable for utilization in the engine 20. The blending mask ensures that accurate and consistent blends are made in operations that require or utilize manual removal of material.

Figure 5:
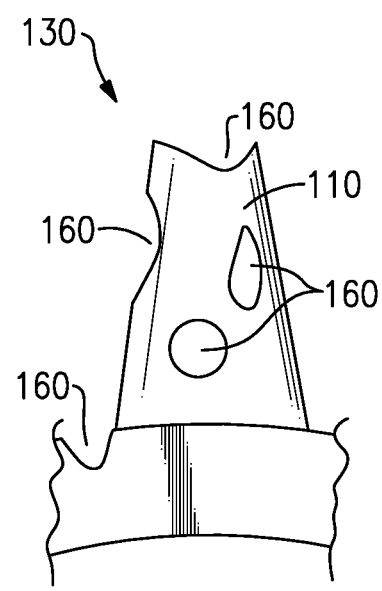
FIG. 5 schematically illustrates the exemplary portion of the integrally bladed rotor of FIG. 3 after having been repaired.

Once the blending mask 150 has been applied, material is removed using the generally manual material removal operation resulting in a blended blade portion 130 including multiple removed material positions 160, as is illustrated in FIG. 5. In other embodiments, explicit instructions are derived from the automated process and supplied to a computer controlled machine. In this instance, blending masks are not required as the manual blending operation is replaced by the machine automated process. Integrally bladed rotor blends may be by either manual or automated processes, or a combination of those processes. In wholly automated processes, the creation of the mask can be omitted.

When determining the position of the blending mask 150, and the amount of material removed from each removed material position 160, it is important to ensure that certain characteristics of the integrally bladed rotor 100 are maintained. By way of example, it can be important to maintain a rotational balance of the integrally bladed rotor 100, to maintain an airfoil performance of each blade 110 of the integrally bladed rotor 100, maintain vibratory performance of the integrally bladed rotor 100, or any similar constraint or a combination of constraints.

In addition to removing the locations of the wear 140, it is beneficial to remove material deeper than the observed damage in order to ensure that all damage is removed and to prevent the propagation of new damage. In some examples, a blend aspect ratio (e.g. a length-depth ratio) is maintained in order to ensure that there is a smooth and gradual transition from the edge of the undamaged blade 110 to the bottom of the deepest portion of the blend, and then back to the undamaged surface of the blade 110 on the other side of the blend.

In determining where to place the blend, and how much material to remove within a blend, there are structural, aerodynamic and aeromechanical criteria that should be satisfied. If the criteria are not satisfied, then there is a risk that the repaired integrally bladed rotor 100 will not be capable of meeting the required operational characteristics of an engine resulting in degradation to the performance of the engine, as well as a reduction in the length of time that the engine can be maintained on wing.

While illustrated in FIGS. 2-5 with blending solutions applied to the rotor itself, as well as to the edges of the airfoil it is appreciated that in a practical repair implementation, blending is generally reserved for edges of the airfoil, with limited applications on the rotor itself. The illustrated wear 140, masking 150, and repair 160 on the rotor are exemplary of the limited applications and not of every repair made according to the description herein.

In order to assist with the blending process, and ensure that minimal additional repairs need to be performed, a semi-automated blending system is utilized to identify which portions of the integrally bladed rotor 100 should be blended, and by how much. With continued reference to FIGS. 1-5, FIG. 6 schematically illustrates a semi-automated blending repair process 600 utilized to repair the article described above. As used herein, a semi-automated process refers to a process in which some portions are performed by an automated system, and some are performed manually.

Initially, the engine component is removed from the engine and manually and/or automatically or some combination thereof inspected in an "Inspect Component" step 610. The inspection includes identification of visible damage, as well as using inspection results to determine structural parameters related to blade criteria such as blade frequency characteristics, mistuning characteristics, mode shape characteristics, edge damage, and aeromechanical performance characteristics. These parameters are measured in a non-operating, or cold, state.

Once determined, the parameters are provided to a computer system including a finite element model of the ideal component, and a damaged component finite element model is created based on the finite element model of the ideal component and the measured parameters of the damaged component in a "Create Analytical Model" step 620. The damaged component finite element model is a modification of the original finite element model that reflects the specific damage or wear present on the damaged component. While some of the parameters related to the blade criteria can be determined in the inspection of the inspected component step 610, the creation of the damaged component finite element model allows the semi-automated process 600 to utilize an analytical model that predicts how the damaged component will react under operating conditions of an engine. As used herein, operating conditions are referred to as "hot" conditions.

The damaged component finite element model is then provided to an airfoil blend module in a "Calculate Blend Solution" step 630. The airfoil blend module determines a suggested blend procedure, including locations of the blend, and depth of each blend by mapping the set of criteria onto the damaged component finite element model during hot conditions and utilizing the set of criteria to determine how and where to dispose the blends. Criteria include, but are not limited to, structural strength and fatigue, aerodynamic efficiency, aerodynamic operability, etc. In some examples, portions of the blend solution can be manually entered by a technician, with the automated process building the solutions based on the initial manual entries.

Once the suggested blend procedure has been determined, a finite element model of the expected resultant component is determined and the structural, aerodynamic, and aeromechanical parameters of the expected resultant component are determined by modeling inclusion of the finite element model of the resultant component in hot conditions in a "Predict Results" step 640. The predict results step 640 outputs a set of data indicative of the expected structural, aerodynamic, aeromechanical, and modeshape parameters of the expected resultant component (i.e. the expected repaired component profile) under hot conditions.

The set of data is compared to pre-established acceptable criteria in a "Criteria Check" step 645. In some examples the criteria check step 645 can include determining if the operational parameters of the expected resultant component finite element model fall within predefined ranges. If one or more of the criteria do not fall within predefined ranges, the blend solution calculated at step 630 is determined to be invalid. When the blend solution is determined to be invalid, the process can either recalculate the blend solution by providing the resultant parameters to the calculate blend solution step 630 or the process 600 can indicate that the component should be held for a rework in a "Hold for Rework" step 647. Once a component has been placed in the hold for rework step 647, it can either be placed in storage until a new repair process is determined, or manually reviewed by a technician for potential blend solutions.

If the parameters of the expected resultant component finite element model fall within predefined ranges, the blend solution calculated at step 630 is determined to be valid. And the process 600 creates a blend template in a "Create Blend Template" step 650. During the create blend template step 650, the system converts the solution determined in the calculate blend solution step 630 into a blend template that can be applied either physically to the damaged component, or to a computer model, such as a CAD model, of the damaged component.

In examples where the physical blend process is automated, or partially automated, the blend template further includes instructions and parameters for the automated material removal machine. In such examples, the blend template is transmitted to the material removal machine, and provided to a technician via any computerized output.

In alternative examples, where the material removal is performed manually, the blend template can be a physical mask made, for example, from a stereolithography material and process is applied to the damaged component. The masking indicates where material should be removed, and how much material should be removed.

In yet further examples, a combination of the physical masking, and a computerized 3D model can be utilized to assist a material removal process performed by a technician.

Once the blend template has been applied to the component, the material removal process is performed in a "Blend Component" step 660. As described above, the material removal process can be manual, automated or a combination of the two. Once the component has been blended, and any finishing processes (such as coatings) have been completed, the repaired component is able to be installed in the engine in an "Install Component" step 670.

In some examples, an optional verification of the repaired component is performed to verify that the finished product meets the criteria from the first criteria check 645. In examples implementing this option, the repaired component is measured, and a finite element model of the repaired component is created in a "Measure/Analyze Results" step 680 in the same manner as in steps 610 and 620. The finite element model of the repaired component is then analyzed using the same process as the predict results step 640, and the outputs are checked against the same pre-established criteria to determine if the repaired component is valid. If valid, the process 600 proceeds to the install component step.

If not valid, then the repaired component is either reblended by returning the process to the calculate blend solution step 630, or is held for reworking at the hold for rework step 647.

Figure 6:
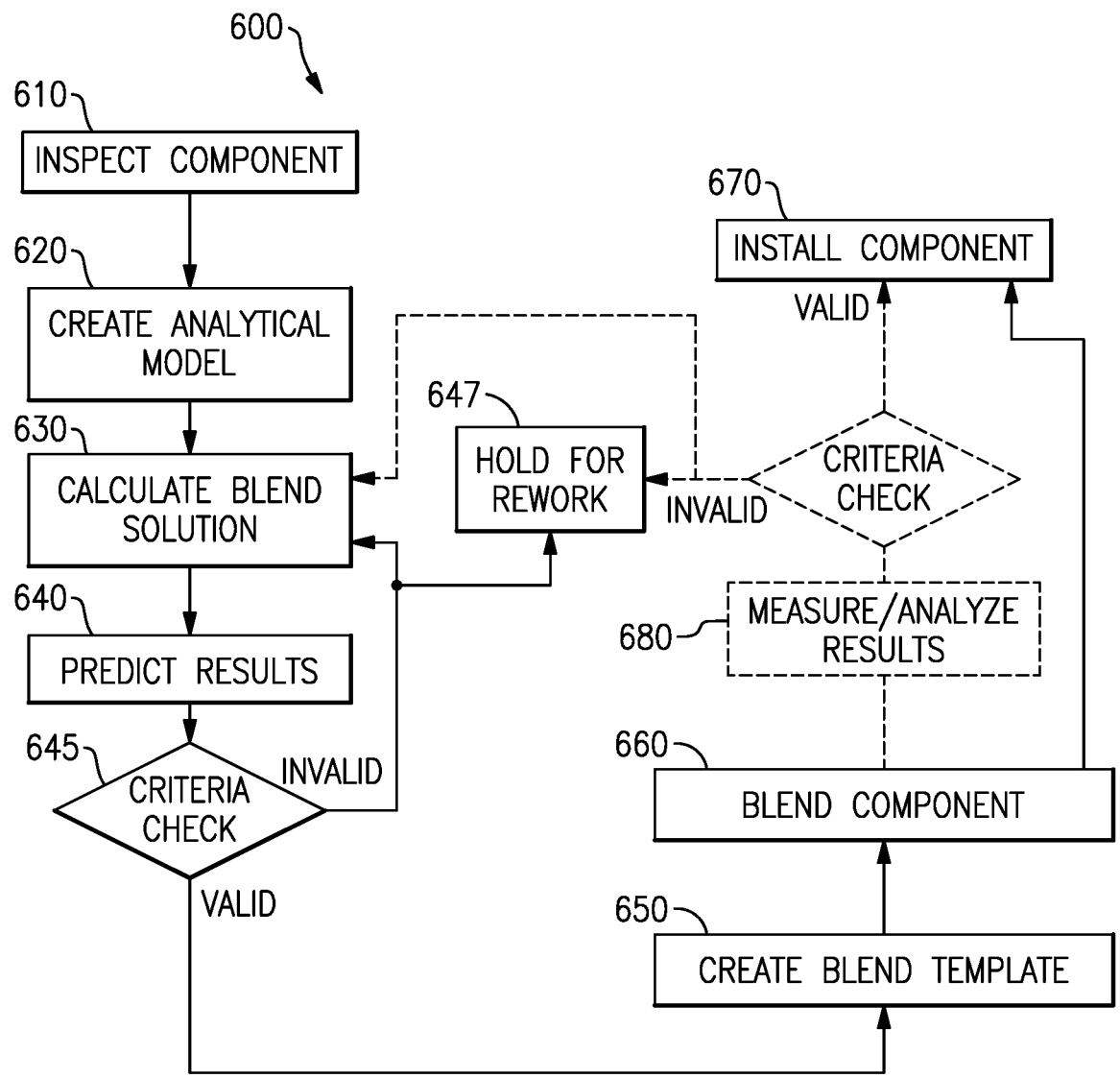
FIG. 6 schematically illustrates a process for determining the repair procedure and for repairing the integrally bladed rotor of FIG. 2.

By utilizing the semi-automated blending repair process of FIG. 6, components can be repaired and re-qualified with substantially more repair locations included and/or substantially deeper blends into the airfoil blade 110. In a theoretical example, the semi-automated process described above can allow for an infinite number of wear spot conditions and blending depths, depending on the specific criteria of a given component. In one specific example, an integrally bladed rotor repaired according to the semi-automated process described herein can have up to 5% of the blade surface covered in wear spots, and can utilize blends intruding up to 3 mm (0.118 in) into the surface of the airfoil blade 110.

While described herein within the context of an integrally bladed rotor, it should be understood that the same process for determining and implementing a repair operation can be applied to any similar component, including individual airfoil blades, stators, rotors, blade outer air seals, and the like, while still falling within the purview of this disclosure.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A process for repairing an aircraft engine component comprising:
   receiving a plurality of component measurements of a damaged component;
   comparing the plurality of component measurements of the damaged component to a finite element model of an ideal component, and generating a finite element model of the damaged component based at least partially on the comparison;
   determining a blend operation based at least in part on the finite element model of the damaged component, the blend operation comprising determining a distinct blend for each of multiple wear spots;
   predicting a performance of an expected repaired component by providing the finite element model of the damaged component and the blend operation to a mathematical model; and
   removing material from the damaged component according to the blend operation, thereby creating an actual repaired component;
   determining a plurality of component measurements of the actual repaired component and comparing the plurality of component measurements of the repaired component to the finite element model of the ideal component, thereby determining a finite element model of the actual repaired component; and
   analyzing the finite element model of the repaired component by providing the finite element model of the repaired component the mathematical model.

2. The process of claim 1, wherein the damaged component is an integrally bladed rotor.

3. The process of claim 1, wherein determining the blend operation comprises creating a material removal template and applying the material removal template to the damaged component prior to removing material from the damage component.

4. The process of claim 1, wherein removing material from the damaged component according to the blend operation comprises an automated material removal operation.

5. The process of claim 1, wherein removing material from the damaged component according to the blend operation comprises a manual material removal operation.

6. The process of claim 1, wherein the repaired component includes a blade, and wherein the distinct blends cover at least 5% of the surface of the blade.

7. The process of claim 1, wherein the repaired component includes at least one blend extending into the repaired component by at least 3 mm (0.118 in).

8. The process of claim 1, further comprising comparing a result of providing the finite element model of the damaged component and the blend operation to the mathematical model against a predetermined set of criteria, and determining the acceptability of the blend operation based at least in part on the output of the mathematical model.

9. The process of claim 8, wherein determining the acceptability of the blend operation includes comparing the output of the mathematical model to at least one of a mistuning range, an aeromechanical performance metric range, and a modeshape range.

10. The process of claim 1, wherein the repaired component includes a plurality of blades extending radially outward from a hub and at least one of the multiple wear spots is disposed on the hub.

11. The process of claim 10, wherein at least one of the multiple wear spots is disposed on a blade in the plurality of blades.

12. The process of claim 1, wherein analyzing the finite element model of the repaired component comprises, comparing a result of providing the finite element model of the repaired component to the mathematical model against a predetermined set of criteria, and determining the acceptability of the blend operation based at least in part on the output of the mathematical model.

13. The process of claim 12, wherein determining the acceptability of the blend operation includes comparing the output of the mathematical model to at least one of a mistuning range, an aeromechanical performance metric range, and a modeshape range.

14. A process for repairing an integrally bladed rotor comprising:
   removing material from the damaged integrally bladed rotor according to the blend operation, thereby creating a repaired integrally bladed rotor, in response to the simulation meeting the predetermined criteria;
   determining a plurality of component measurements of the repaired integrally bladed rotor and comparing the plurality of component measurements of the repaired integrally bladed rotor to the finite element model of the ideal integrally bladed rotor, thereby determining a finite element model of the repaired integrally bladed rotor; and
   analyzing the finite element model of the repaired integrally bladed rotor by providing the finite element model of the repaired integrally bladed rotor to a mathematical model.

15. The process of claim 14, wherein determining the blend operation comprises creating a material removal template and applying the material removal template to the damaged integrally bladed rotor prior to removing material from the damaged integrally bladed rotor.

16. The process of claim 14, wherein the predetermined criteria includes at least one of mistuning range, an aeromechanical performance metric range, and a modeshape range.

17. The process of claim 14, further comprising reiterating the step of determining a blend operation in response to the simulation not meeting at least one of the predetermined criteria.

18. The process of claim 17, wherein the reiteration further incorporates the results of the corrective finite element model simulation, and wherein the reiteration generates a second blend operation distinct from the first blend operation.

* * * * *

UNITED STATES PATENT AND TRADEMARK OFFICE
CERTIFICATE OF CORRECTION

PATENT NO. : 11,434,764 B2  
APPLICATION NO. : 16/520951  
DATED : September 6, 2022  
INVENTOR(S) : Robert J. Morris et al.

It is certified that error appears in the above-identified patent and that said Letters Patent is hereby corrected as shown below:

In the Claims

In Claim 14, Column 10, Line 38; replace "comprising: removing" with --comprising:
 receiving a plurality of integrally bladed rotor measurements of a damaged integrally bladed rotor;
 generating a finite element model of the damaged integrally bladed rotor based at least partially on a finite model of an ideal integrally bladed rotor;
 determining a blend operation by at least simulating the damaged integrally bladed rotor under hot conditions, the blend operation comprising determining a distinct blend for each of multiple wear spots;
 creating a corrective finite element model based on the determined blend operation, simulating operations of the corrective finite element model under hot conditions, and comparing the simulation to a set of predetermined criteria;
 removing--

Signed and Sealed this  
Twenty-fifth Day of October, 2022

Katherine Kelly Vidal  
*Director of the United States Patent and Trademark Office*